United States Patent [19]

Hulkko et al.

[11] Patent Number: 5,734,683

[45] Date of Patent: Mar. 31, 1998

[54] DEMODULATION OF AN INTERMEDIATE FREQUENCY SIGNAL BY A SIGMA-DELTA CONVERTER

[75] Inventors: Jaakko A. Hulkko; Veijo L. H. Kontas, both of Oulu, Finland; Lauri T. Siren, San Diego, Calif.

[73] Assignee: Nokia Mobile Phones Limited, Salo, Finland

[21] Appl. No.: 624,113

[22] Filed: Mar. 29, 1996

Related U.S. Application Data

[63] Continuation of Ser. No. 303,613, Sep. 9, 1994, abandoned.

[30] Foreign Application Priority Data

Sep. 10, 1993 [FI] Finland ............... 933989

[51] Int. Cl.[6] .................... H04B 14/06; H04L 27/22
[52] U.S. Cl. .................... 375/316; 375/247; 375/328; 375/329
[58] Field of Search .................... 375/240, 244, 375/247, 316, 328–329, 332; 341/143

[56] References Cited

U.S. PATENT DOCUMENTS

| | | | |
|---|---|---|---|
| 5,155,743 | 10/1992 | Jacobs | 375/247 |
| 5,179,380 | 1/1993 | White | 341/143 |
| 5,191,332 | 3/1993 | Shieu | 341/143 |
| 5,198,817 | 3/1993 | Walden et al. | 341/143 |
| 5,305,004 | 4/1994 | Fattaruso | 341/143 |

FOREIGN PATENT DOCUMENTS

| | | |
|---|---|---|
| 0168 220 | 1/1986 | European Pat. Off. . |
| 0 186 151 A3 | 7/1986 | European Pat. Off. . |
| 0335 037 | 10/1989 | European Pat. Off. . |
| 0 461 720 A1 | 12/1991 | European Pat. Off. . |
| 0461 720 | 12/1991 | European Pat. Off. . |
| 0499 827 | 8/1992 | European Pat. Off. . |
| 2233 518 | 1/1991 | United Kingdom . |
| WO 89/07368 | 8/1989 | WIPO . |
| WO 91/10283 | 7/1991 | WIPO . |

OTHER PUBLICATIONS

IEE Journal of Solid–State Circuits., vol. 26, No. 12, Dec. 1991, New York US pp. 1951–1957, K. Lakshmikumar et al., 'A Baseband Codec For Digital Cellular Telephony'.

Signal Processing., vol. 22, No. 2, Feb. 1991, Amsterdam NL, pp. 139–151, H.J. Dressler, 'Interpolative Bandpass–A/D–Conversion'.

The Design of Sigma–Delta Modulation, Analog–To–Digital Converters, B. Boser et al., IEEE Journal of Solid–State Circuits, vol. 23, No. 6, Dec. 1988, pp. 1298–1308.

Digital Communication, E. Lee et al., Kluwer Academic Publishers, Boston, 1990, pp. 173–176.

Primary Examiner—Young T. Tse
Attorney, Agent, or Firm—Perman & Green, LLP

[57] ABSTRACT

A sigma-delta signal converter is implemented using switched capacitor switching elements in which a first switch (31) serves as a mixer (11). The output of the mixer is directed to the second input of an adder (16), and its second input is the feedback signal (f1) of the sigma-delta signal converter, which is also directed into a base-frequency output signal through a decimator (14) and low-pass filtering (15).

16 Claims, 3 Drawing Sheets

DEMODULATION OF AN INTERMEDIATE FREQUENCY SIGNAL BY A SIGMA-DELTA CONVERTER

This is a continuation of application Ser. No. 08/303,613 filed on Sep. 9, 1994, now abandoned.

BACKGROUND OF THE INVENTION

The invention relates to a receive arrangement for receiving a modulated carrier signal.

EP 0 461 720-A1 describes a known receive arrangement for receiving a modulated carrier signal, comprising a mixer/demodulator driven with a sinusoidal oscillator of carrier frequency fc, at least one adder, a low-pass filter, a pulse shaper constituting a one-bit sigma-delta signal converter, all included in a closed signal loop, the pulse shaper being driven with sampling frequency fs, and further comprising a digital decimation filter. In this type of receive arrangement the modulated carrier signal is demodulated in the closed signal loop by the mixer/demodulator, the output signal of which is converted after passing through the low-pass filter into a digital signal by the sigma-delta converter.

A typical prior art sigma-delta converter arrangement is described in greater detail with reference to FIG. 1 of the drawings.

An incoming intermediate frequency IF carrier signal is provided to each branch of the receive arrangement. In each branch the incoming signal is filtered through bandpass filter 1 and mixed to a baseband signal in a linear mixer 2 using a sinusoidal local oscillator signal LO1 at the IF frequency. A high time constant capacitor 3 is provided on each of the incoming signal branches to remove direct currents from the baseband signal. The gain of the circuit is controlled through Automatic Gain Controllers (AGC) 5 and the baseband signals are converted to digital signals in modulators 6. After modulation the signals pass through respective decimators 7 and post filters 8 to remove spurious signals created by the decimators. The specific details of the local oscillator frequency and phase shifts of the particular arrangement illustrated in FIG. 1 are as follows:

PHI1=+45°

PHI2=−45°

PHI3=PHI4=0°

LO1=IF

LO2=oversampling frequency

The demodulation, i.e., the mixing of the intermediate frequency (bandpass-filtered) int-signal down to the base frequency is traditionally based on the use of a multiplier. Thus the modulated IF-signal is multiplied by the sinusoidal oscillator signal (LO1). In the synchronous demodulation the frequency and the phase of the oscillator are locked to the carrier wave with the aid of a phase-locked loop (PLL), for instance. The frequency spectrum of the mixed product consists of the desired base-frequency component and the component spectrums which are removed by low-pass filtering prior to entering the sigma-delta converter. Such a mixing process may be described by the following trigonometric equation:

$$\cos(a) * \cos(b) = \tfrac{1}{2} * \cos(a-b) + \tfrac{1}{2} * \cos(a+b) \qquad (1)$$

Equation (1) holds only if both products are pure cosine signals.

If cos(a) now represents the modulated int-carrier wave then:

$$a = \omega 0 * t + PHI \qquad (2)$$

where ω0 is the angle frequency of the carrier wave and PHI is a momentary phase modulation (QAM, MSK, QPSK, GMSK . . . .).

Ideally the term cos(b) represents a clean, mixing oscillator frequency (LO):

$$b = n * \omega 1 * t\ (n=1, 2, 3, \ldots) \qquad (3)$$

where n*ω1 is the angular frequency of the oscillator of the mixer.

In the ideal case the frequency and the phase of the oscillator are locked to the frequency and the phase of the carrier wave of the input signal (in), in these conditions ω0=n*ω1, and the term ½*cos(a−b) is reduced to ½*cos (PHI). This base-frequency phase difference signal conveys the data symbols. Term ½*cos(a+b) represents the component of the frequency spectrum on frequency 2*ω0.

When prior art receive arrangements such as those described above are implemented by discrete components they require a very large area on the printed circuit board. In addition, as the signal entering the sigma-delta converter is a baseband signal the ac-coupled branches need very low high-pass corner frequencies with high time constants in order to accomplish dc blocking. This means that it is not efficient for the arrangement to be powered down as often as would be ideal, as powering up again is slow and as a result the circuit cannot be powered down for short periods, the circuit therefore, consumes a large amount of power.

SUMMARY OF THE INVENTION

In accordance with the present invention there is provided a receiver for receiving a modulated carrier signal comprising, a sigma-delta signal converter having at least one adder included in a feedback loop, characterised in that the arrangement comprises a time discrete sampling means for down converting the modulated carrier signal prior to the feedback loop.

By down converting the carrier frequency signal using a time discrete sampling means a number of advantages are provided. Firstly, an expensive sinusoidal oscillator is no longer required with space and cost benefits. Secondly, although use of time discrete sampling means, rather than a pure sinusoidal local oscillator for down converting the IF signal means that mixing occurs at the frequency of sampling and also at harmonics of the sampling frequency this perceived disadvantage can be used to the system's advantage enabling samples to be taken using a local oscillator sampling at a subharmonic frequency of the carrier signal. Thus can also give important power savings.

One way in which the invention can be implemented is by using the input stage of a sigma-delta signal Converter having switched capacitor switching elements to implement the time discrete sampling means that acts as a mixer. The sigma-delta converter with the desired switched capacitor switching elements provided at the input stage may be implemented as an ASIC. The output of this mixer can then be directed to the first input of an adder included in the closed feedback signal loop of the sigma-delta converter. This adder comprises, as the second input, the feedback signal of the sigma-delta signal converter, which is also directed through a decimator and low-pass filter to provide an output signal which is provided to the second input of the adder.

In circuits of embodiments of the invention the incoming modulated signal may be mixed into a base-band frequency signal or a frequency approaching the base-band frequency prior to entering the closed feedback loop.

Sigma-delta converters are traditionally used in converting base-band signals. However, in accordance with the invention, they can now be adapted for converting intermediate frequency signals directly.

Difficult ac-coupling problems, control and high-pass filtering problems are solved by circuit arrangements of embodiments of the invention. Similarly, power consumption can be decreased by shortening the time for switching the receiver on from stand-by to the active State. This enables the circuit to be powered down when not in use for shorter periods than would conventionally be possible as a capacitance with a lower time constant is adequate for dc blocking.

An additional advantage can be gained by using switched capacitors to provide some of the automatic gain control of the circuit. This means that the number of AGC-circuits required by the receive arrangement as a whole can be decreased. With embodiments of the invention part of the necessary filtering can also be provided without the need for additional filters between the mixing and a–d converting stages by utilising a digital filter already present in the sigma-delta converter.

Embodiments of the invention can be utilized advantageously in, for example, radio telephones.

BRIEF DESCRIPTION OF THE DRAWINGS

Embodiments of the invention will now be described in greater detail with reference to FIGS. 2 to 4 of the drawings of which.

DETAILED DESCRIPTION OF THE INVENTION

Figure 1:
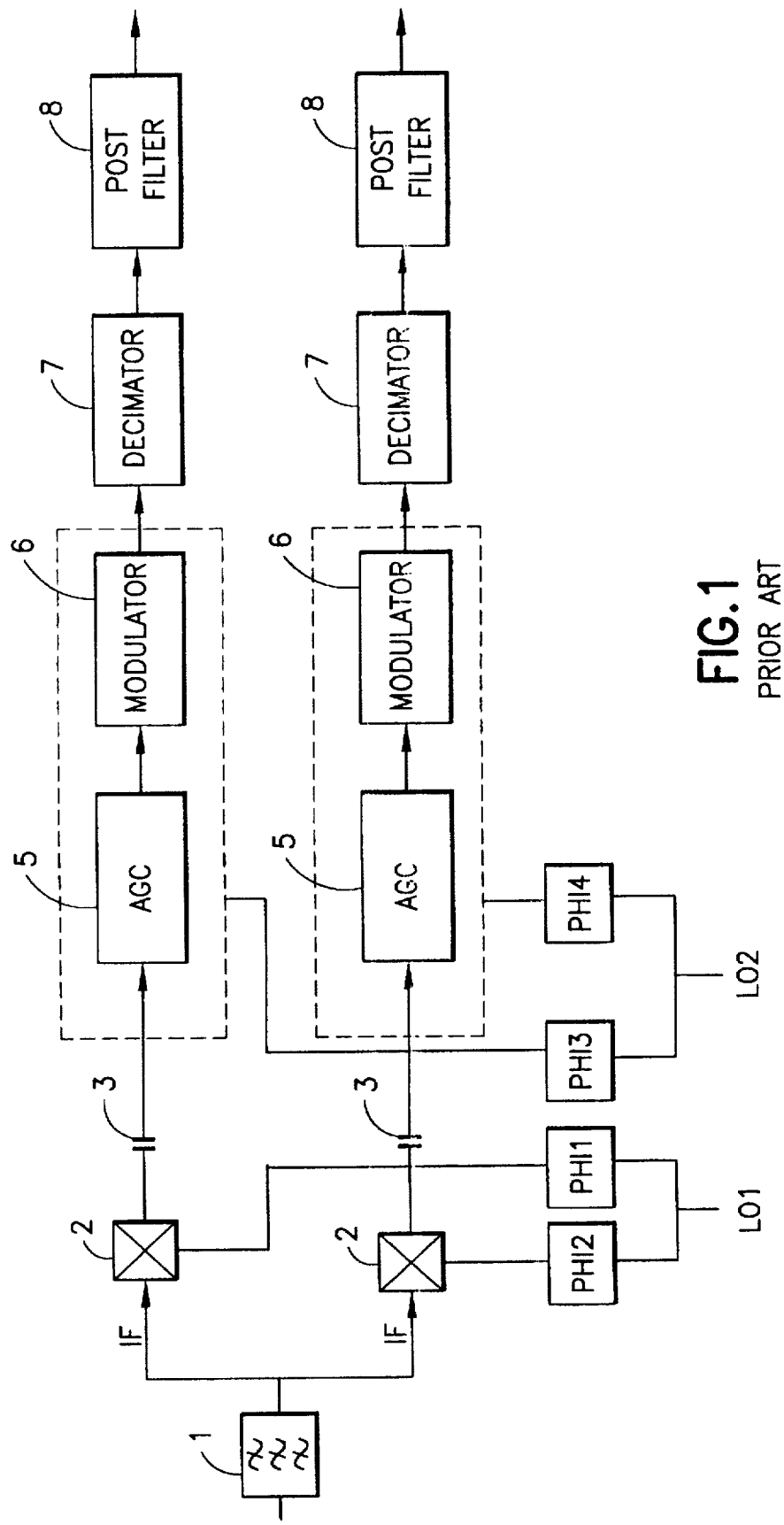
FIG. 1 is a block diagram of a conventional sigma-delta converter of the prior art.
Figure 2:
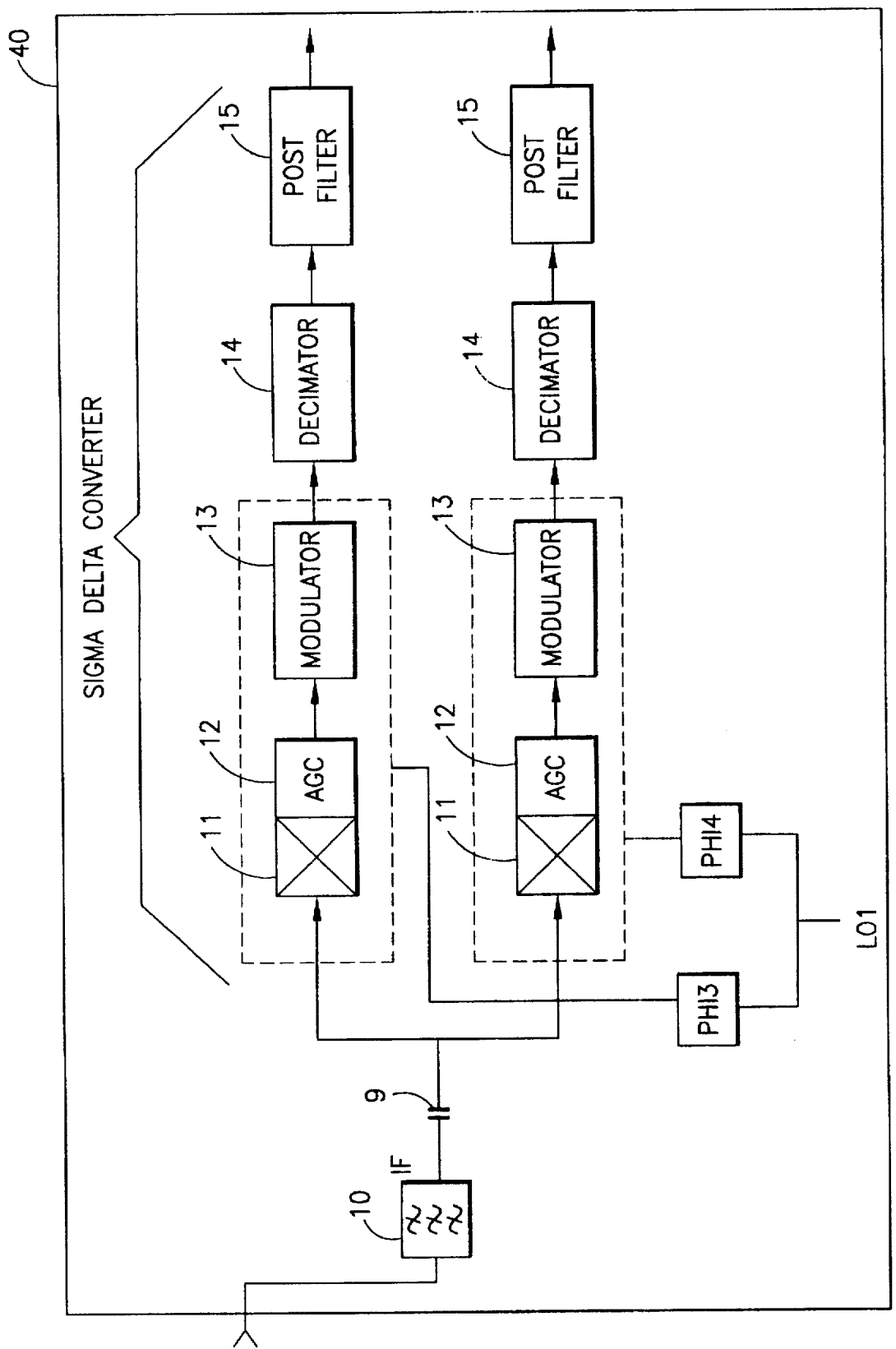
FIG. 2 is a block diagram of a sigma-delta converter included in a receive arrangement according to one embodiment of the invention.
Figure 4:
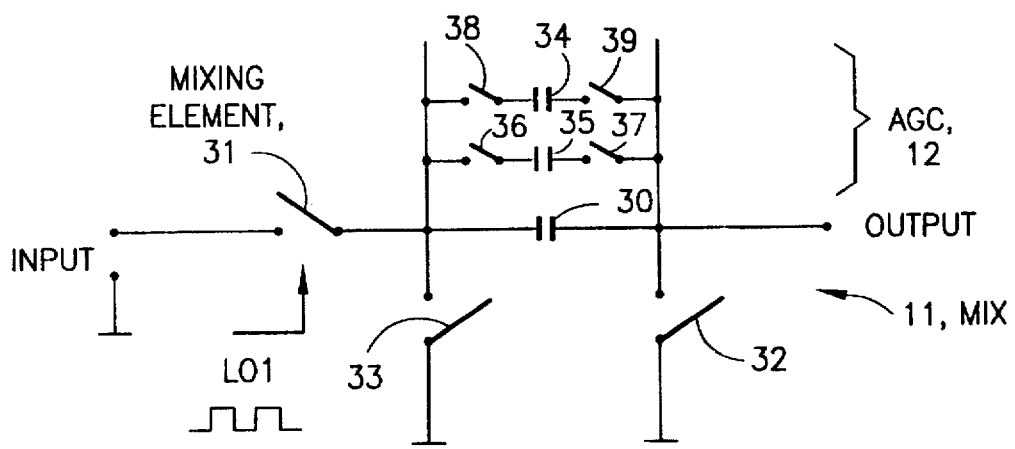
FIG. 4 is a schematic representation of a switched capacitor switching element suitable for implementing the mixing and automatic gain control functions of the embodiment of FIG. 2.

The receive arrangement of an embodiment of the invention is illustrated in FIG. 2 using a sigma-delta analog-digital converter with a large dynamic input range in which a mixer 11 is implemented using switched capacitor switching elements 30–39 illustrated in FIG. 4. The receive arrangement of this embodiment receives radio signals for a radio telephone 40. The switched capacitor switching elements providing the mixing function of the mixer 11 are driven by a square wave local oscillator signal (LO1) at (or near) the frequency of the IF signal. Both the mixer and the local oscillator signal are digital. Switched capacitor switching elements are also provided to implement an automatic gain controller (AGC) 12 providing an automatic gain control function for the circuit. The receive arrangement includes a bandpass filter 10, and each branch further includes a modulator 13 that converts signals from analog signals to digital signals, a decimator 14 and a post filter 15 which perform the same functions as the correspondingly named portions of the prior art receive arrangement illustrated in FIG. 1. The prefiltering of the signal (after modulation) can be designed to freely correspond to the design demands of the respective circuit and the dc-deviation of the sigma-delta converter can be corrected using the internal, digital correction of deviations.

The phase and frequency details for the local oscillator signals provided to the respective branches are as follows:
PHI3=+45°
PHI4=−45°
LO1=IF A base-frequency output signal is obtained from the modulator after the decimator and the low-pass filter which can be processed to retrieve the modulating information. Because the signal entering the sigma-delta converter arrangement is an IF signal, only a short time-constant capacitor 9 is necessary for preventing dc signals from transferring to the sigma-delta converter. This means that the device can be powered up and down more quickly and as less power is required to power up, short term power downs are practical making the arrangement more power efficient than conventional receive arrangements.

The mixer 11 and modulator 13 are described in greater detail with reference to FIG. 3. The modulated reception signal (in), for instance a bandpass-filtered int-signal from the RF-part of the radio telephone 40, is directed to the mixer 11 (mix) to which the local oscillator (LO1) signal is also applied. LO1 may be on or around the carrier frequency of the received signal (in) or a subharmonic of that frequency. The output of mixer 11 is directed to a first adder 16, the second input of which is a feedback signal f1. The output of the first adder 16 is directed to an integrator 17. The output of the integrator 17 is directed to a second adder 18, the second input of which is a feedback signal f2. The output of the second adder 18 is directed to a second integrator 19 and further to a comparator 20. The output signal (out) of the comparator 20 is further directed to the decimator 14 the (low-pass) post filter 15 for filtering out unwanted signals resulting from mixing of LO1 and the carrier signal.

The output signal provides a base-frequency signal which can be processed using digital signal processing means, for instance. The output signal (out) is coupled to the first and second adders 16 (f1) and 18 (f2) in respective feedback branches.

The second adder 18, the second integrator 19 (int2) and the comparator 20 (cmp) provide a second closed feedback loop in the circuit. Those skilled in the art know the basic idea of the sigma-delta converter, therefore it is not described in more detail in this connection. More detailed discussion can be found in the articles: The Design of Sigma-Delta Modulation Analog-to-Digital Converters, Bernhard E. Boser, Bruce A. Wooley, IEEE Journal of Solid-State Circuits, Vol. 23 No. 6 December 1988 and Oversampling Delta-Sigma Data Converters, Theory, Design and Simulation J. C. Candy and G. C. Temes IEEE press 1992 both incorporated herein by reference.

Typically in the prior art an analog bandpass filter is provided prior to entering the modulation stage of the sigma-delta converter to remove unwanted signals resulting from mixing. In the present case, however, the digital filtering function of the sigma-delta converter itself can be used to remove the unwanted signals.

FIG. 4 shows the input stage of the receive arrangement of the embodiment of FIG. 2 showing switched capacitor switching elements of the mixer 11 and the AGC 12 in greater detail. A first capacitor 30 is used to sample end hold the incoming signal. First switches 31, 32 are closed to provide a sample to the first capacitor 30. Once the input signal has been sampled, a third switch 33 is closed to transfer the charge on the first capacitor 30 to the output. Second and third (and possibly further) capacitors 34, 35 are provided in parallel with the first capacitor 30. These are each controllably connected to the input and output through a pair of switches 36, 37; 38, 39. By closing the appropriate switches and adding parallel capacitance from one or more of the second and third capacitors 34, 35 the signal transfer ratio can be changed. The switches are under the control of an external cpu and can be used to replace automatic gain control steps of the circuit as a whole. In this way amplification steps can be included in the sigma-delta modulator by altering the ratios of the input capacitances.

The mixer 11 can be considered as a sample and a hold circuit that samples the input signal in synchronization with the oscillator and directs the samples to the output as a signal which remains constant for the period of the sampling interval. The oscillator signal (LO1) is therefore represented by a square wave with a base frequency of n*ω1. Instead of the term $\cos(b)=\cos(n*\omega1*t)$ of equation (1), the following series of odd harmonics is obtained:

$$\cos(n*\omega1*t)+\tfrac{1}{3}*\cos(3*n*\omega1*t)+\tfrac{1}{5}*\cos(5*n*\omega1*t)+\ldots \quad (4)$$

The cosine terms of a higher order are mixed in the mixer (11) with the input signal (in) producing sum and difference components of the frequencies to the spectrum of the output signal of the mixer (11). In the prior art, instead, all input signals on a higher frequency than the base frequency are filtered by a filter before entering the mixing stage of the sigma-delta converter.

It is preferable to use the first switch 31 of the switched capacitor switching element as the mixing element. In this case, signal bands around the multiples of the frequency of the local oscillator signal LO1 are folded onto the base frequency. The local oscillator base frequency or its subharmonics can therefore be used to down convert the carrier signal to the base-band or a frequency approaching the base-band. The unwanted signals resulting from mixing using the local oscillator are removed by filtering.

Referring back to FIG. 2, the inventive idea is realized in the circuit arrangement of this embodiment of the invention in accordance with which switched capacitor switching elements present in the input stage of a sigma-delta converter are used to implement the mixer 11 which directly demodulates the IF-signal into a base-frequency signal; in other words, the IF-signal and its multiples are folded on the base frequency. The first switch 31 in the input of stage of the sigma-delta converter is utilized here to serve as the mixer 11.

Figure 3:
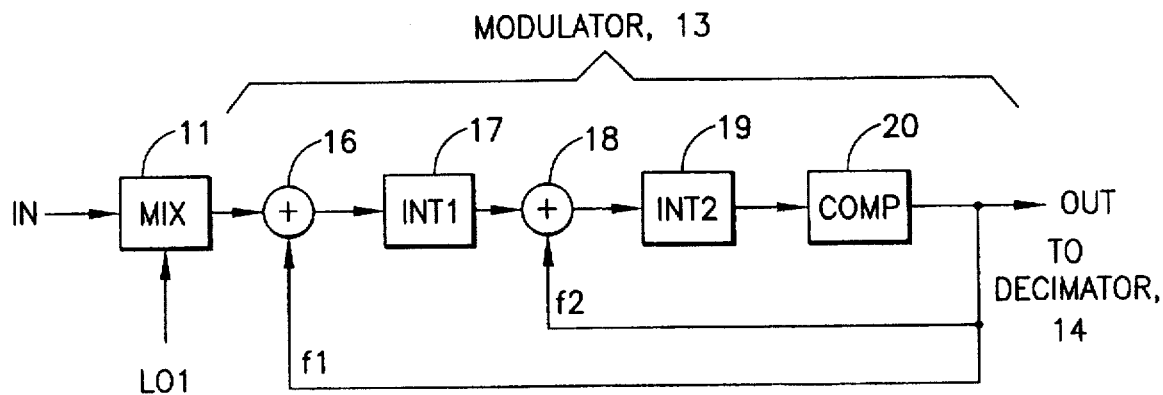
FIG. 3 is a schematic representation of an embodiment of a receive arrangement including the sigma-delta converter of FIG. 2 operating with a local oscillator at or near the carrier frequency of the incoming signal.

The embodiment of FIGS. 2 to 4 can be implemented using a local oscillator having a frequency LO1 that is the same as or approaching the frequency of the IF carrier signal. Although it would generally be desirable for LO1 to have the same frequency as the incoming signal it may in many instances be desirable or merely practical to use a local oscillator frequency LO1 offset slightly from the frequency of the IF carrier signal, the mixing frequency could, for instance, be LO+Δf (where LO is the frequency of the IF carrier). In this case the signal (in) applied to the input is folded to the frequency Δf which is almost to the baseband frequency. If the modulated intermediate frequency (in) is 1010 kHz, the mixing signal LO+Δf may be 900 kHz, for instance, whereby the demodulated signal is on the frequency of −110 kHz with respect to the baseband frequency.

One example of when it may be practical to use a local oscillator with a frequency slightly offset from the IF carrier frequency is when a driver conveniently located in the sigma-delta converter for providing a square wave local oscillator for driving the mixer 11 does not coincide exactly with the IF carrier signal. Another example is when it is desirable to provide four times oversampling. Under these circumstances the subsequent digital mixer can be implemented more easily when the signals are at a frequency Δf offset from the baseband. Typically a signal within 1 MHz of the carrier frequency is acceptable for down converting the incoming signal.

In a conventional arrangement, if the mixing frequency of a sinusoidal local oscillator differs from the IF carrier signal by Δf, the term cos(b) of equation (1) is solved by the following formula:

$$b=n*\omega_1*t+\Delta\omega*t \quad (5)$$

where Δω is the angular frequency corresponding to frequency Δf.

Although equation (1) deals with the mathematics of the prior art solution using a sinusoidal local oscillator, once the down converted signal generated by mixing using the time discrete sampler of embodiments of the present invention is filtered prior to entering the a–d modulation stage, it is effectively a pure cosine signal and equation (1) holds.

The receive arrangement of FIGS. 2 to 4 can also be used to down convert the incoming signal to the baseband (or a frequency approaching the baseband) using a subharmonic of the carrier frequency. In these circumstances the phase and frequency details for the local oscillator signals provided to the respective branches are as follows:

PHI3=+45/N°

PHI4=−45/N°

LO1=IF/N

In other respects the arrangement operates in the same manner as previously described.

When the input signal (in) is branched into two different branches, it is possible to arrange the receive circuit arrangements of embodiments of this invention in each of the branches. The demodulation of an I/Q-modulated signal (I=in the phase, Q=in the phase shift of 90 degrees) may be implemented simply in this way using principles known per se and described by way of example in Digital Communication, Edward A. Lee, David G. Messershmitt, Kluwer Academic Publishers, Boston, 1990 incorporated herein by reference. The clocks of the modulators of both branches are synchronized.

Those skilled in the art will notice that the circuit arrangements of embodiments of the invention are simple to implement using relatively few circuit elements. They result in decreased power consumption and accelerated operation of the circuit (fast shifting from the stand-by state to the active operating state and vice versa) which is especially significant for radio telephones.

The present invention includes any novel feature or combination of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention.

What is claimed is:

1. A receiver for receiving a modulated carrier signal comprising, a sigma-delta signal converter having at least one summing node included in a feedback loop, characterized in that the sigma-delta signal converter comprises a time discrete sampling means located at an input stage of the sigma-delta signal converter controlled by a square wave local oscillator signal for down converting the received modulated carrier signal to a base-band signal, wherein the frequency of the square wave local oscillator signal is equal to one of the carrier signal frequency of the received modulated carrier signal plus an offset frequency Δf, where Δf is equal to one of a value of zero or a value greater than zero, or a subharmonic of the modulated carrier signal frequency.

2. A receiver according to claim 1 wherein the time discrete sampling means comprises a switching member having an input node coupled to said received modulated carrier signal, and wherein said square wave local oscillator signal is coupled to said switching member for controlling the opening and closing of said switching member.

3. A receiver according to claim 1 wherein the time discrete sampling means comprises switched capacitor switching elements.

4. A receiver as set forth in claim 1, wherein said modulated carrier signal is divided into two signals having a predetermined phase relationship one to another, and wherein said receiver is comprised of first and second sigma-delta signal converters each having an input stage comprised of said time discrete sampling means that is controlled by said square wave local oscillator signal, each of said first and second sigma-delta signal converters being coupled to one of said two signals.

5. A receiver as set forth in claim 1, wherein said receiver is a component part of a radio telephone.

6. A circuit for receiving a modulated radio frequency (RF) carrier signal for down converting the received carrier signal to a base-band signal, the circuit comprising a sigma-delta signal converter circuit comprised of a switched capacitor input stage that is switched with local oscillator signal provided in the form of a non-sinusoidal switching signal having a frequency equal to or approximately equal to one of a frequency of said received carrier signal, or a sub-harmonic of said received carrier signal; said switched capacitor input stage outputting the base-band signal; a first summing node having a first input coupled to an output of said input stage; a first integrator coupled to an output of said first summing node; a second summing node having a first input coupled to an output of said first integrator; a second integrator coupled to an output of said second summing node; and a comparator coupled to an output of said second integrator; wherein an output of said comparator is coupled back to a second input of each of said first summing node and said second summing node; said sigma-delta signal converter circuit further comprising a decimator coupled to an output of said comparator and a filter coupled to an output of said decimator.

7. A circuit according to claim 6, characterized in that the local oscillator signal has a frequency given by LO+Δf, whereby the modulated carrier signal is folded on an intermediate frequency Δf.

8. A circuit according to claim 6, characterized in that said input stage is further comprised of a switched capacitor circuit that is controlled by said local oscillator signal.

9. A circuit according to claim 6, characterized in that said input stage comprises a switched capacitor circuit having at least one capacitor that is switchably coupled in parallel with said switched capacitor circuit for implementing an automatic gain control (AGC) function.

10. A circuit as set forth in claim 6, wherein said modulated carrier signal is divided into two signals having a predetermined phase relationship one to another, and wherein said circuit is comprised of first and second sigma-delta signal converter circuits each having said switched capacitor input stage that is switched with said local oscillator signal, each of said first and second sigma-delta signal converter circuits being coupled to one of said two signals.

11. A circuit as set forth in claim 6, wherein said circuit is a component part of a radio telephone.

12. In a radio telephone, a method for converting a received modulated intermediate frequency (IF) signal to a base-band signal, comprising the steps of:

applying the IF signal to an input stage of a sigma-delta converter circuit, the input stage comprising a switched capacitor circuit;

mixing the IF signal to the base-band signal in the switched capacitor circuit by applying a switch control local oscillator (LO) signal having a frequency equal to one of the frequency of the received modulated IF signal plus or minus an offset frequency Δf, where Δf is equal to one of a value of zero or a value greater than zero, or a subharmonic of the received modulated IF signal; and demodulating and converting an output of the switched capacitor circuit to a digital signal by the sigma-delta converter circuit.

13. A method as set forth in claim 12, wherein the step of applying applies the IF signal to input stages of at least two sigma-delta converter circuits, the input stage of each comprising the switched capacitor circuit, wherein the step of mixing occurs in each sigma-delta converter circuit by applying to each input stage the switch control local oscillator (LO) signal, and wherein the LO signals have a predetermined phase relationship one to another.

14. A method as set forth in claim 12, wherein the step of applying includes a preliminary step of bandpass filtering the IF signal.

15. A method as set forth in claim 12, wherein the step of mixing includes a step of varying a signal transfer ratio of the switched capacitor circuit by switchably connecting one or more capacitances in parallel with the switched capacitor circuit.

16. A method as set forth in claim 12, wherein the step of applying the switch control LO signal applies a nominally square wave signal having a period that defines a first phase and a second phase, and wherein the step of mixing includes the steps of sampling the applied IF signal during the first phase, and outputting the sampled IF signal during the second phase.

* * * * *